(12) United States Patent
Ito

(10) Patent No.: US 7,772,491 B2
(45) Date of Patent: Aug. 10, 2010

(54) STRUCTURE OF INTERCONNECTION FITTING OF DIVISION PROTECTORS

(75) Inventor: Seiji Ito, Atsugi (JP)

(73) Assignee: Yazaki Corporation, Tokyo (JP)

( * ) Notice: Subject to any disclaimer, the term of this patent is extended or adjusted under 35 U.S.C. 154(b) by 517 days.

(21) Appl. No.: 11/687,846

(22) Filed: Mar. 19, 2007

(65) Prior Publication Data

US 2007/0249210 A1 Oct. 25, 2007

(30) Foreign Application Priority Data

Apr. 20, 2006 (JP) .............................. 2006-116750

(51) Int. Cl.
*H02G 3/00* (2006.01)
*H02G 3/04* (2006.01)

(52) U.S. Cl. .................. 174/99 R; 174/70 C; 174/68.3; 174/68.1; 248/68.1; 52/220.1; 52/220.7

(58) Field of Classification Search ............... 174/72 A, 174/70 R, 72 R, 73.1, 74 R, 135, 68.1, 68.3, 174/101, 503, 99 R, 70 C; 248/68.1, 74.1; 220/3.2, 3.8; 52/220.1, 220.3, 220.5, 220.7, 52/220.8
See application file for complete search history.

(56) References Cited

U.S. PATENT DOCUMENTS

| | | | | |
|---|---|---|---|---|
| 3,312,251 A * | 4/1967 | Marks et al. | ................ | 174/68.3 |
| 5,597,980 A * | 1/1997 | Weber | ....................... | 174/72 A |
| 5,709,249 A * | 1/1998 | Okada et al. | ................ | 174/68.3 |
| 6,126,123 A * | 10/2000 | Yang | ......................... | 248/74.1 |
| 6,216,746 B1 * | 4/2001 | Guebre-Tsadik et al. | ... | 174/68.3 |
| 6,234,429 B1 * | 5/2001 | Yang | ......................... | 248/68.1 |
| 6,861,589 B2 * | 3/2005 | Katsumata et al. | ......... | 174/68.3 |
| 7,038,133 B2 * | 5/2006 | Arai et al. | .................. | 174/72 A |
| 7,119,275 B2 * | 10/2006 | Suzuki et al. | ................ | 174/503 |
| 7,214,879 B1 * | 5/2007 | Suzuki et al. | ............. | 174/72 A |
| 7,307,217 B2 * | 12/2007 | Daito | ....................... | 174/72 A |

FOREIGN PATENT DOCUMENTS

| | | | |
|---|---|---|---|
| JP | 7-310721 A | | 11/1995 |
| JP | 2001095126 A | | 4/2001 |

OTHER PUBLICATIONS

Translation of Japanese Notification of Reasons for Refusal dated Oct. 13, 2009.

\* cited by examiner

*Primary Examiner*—Angel R Estrada
(74) *Attorney, Agent, or Firm*—Sughrue Mion, PLLC

(57) ABSTRACT

In a structure of interconnection fitting of division protectors fittingly interconnected to form a harness protector, the division protectors have interconnection fitting portions at their end portions. Retaining projections are formed at one of the interconnection fitting portions which are to be fittingly interconnected, and elastic retaining arms are formed at the other interconnection fitting portion. The elastic retaining arm is so formed as to produce an urging force outwardly in a widthwise direction which is generally perpendicular to a fitting/disconnecting direction and also to a longitudinal direction. Elastic deformation limitation walls for limiting elastic deformation of the elastic retaining arm are formed near respectively to the retaining projection and the elastic retaining arm so as to abut against each other upon movement in a predetermined amount in the widthwise direction.

6 Claims, 7 Drawing Sheets

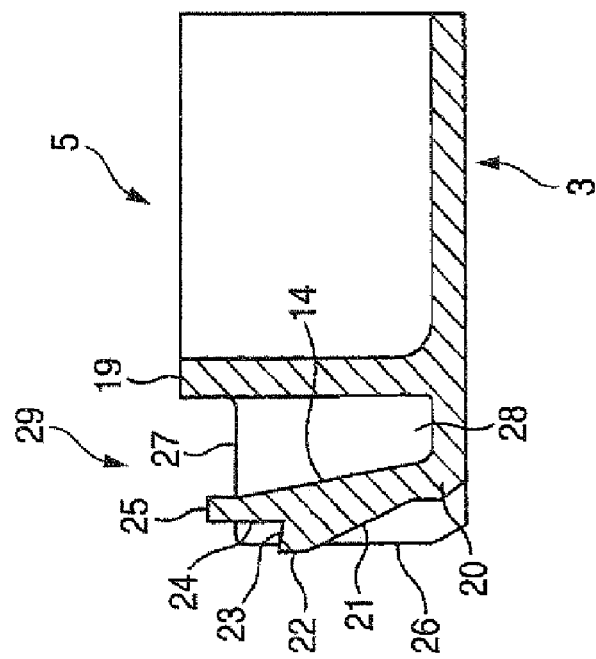
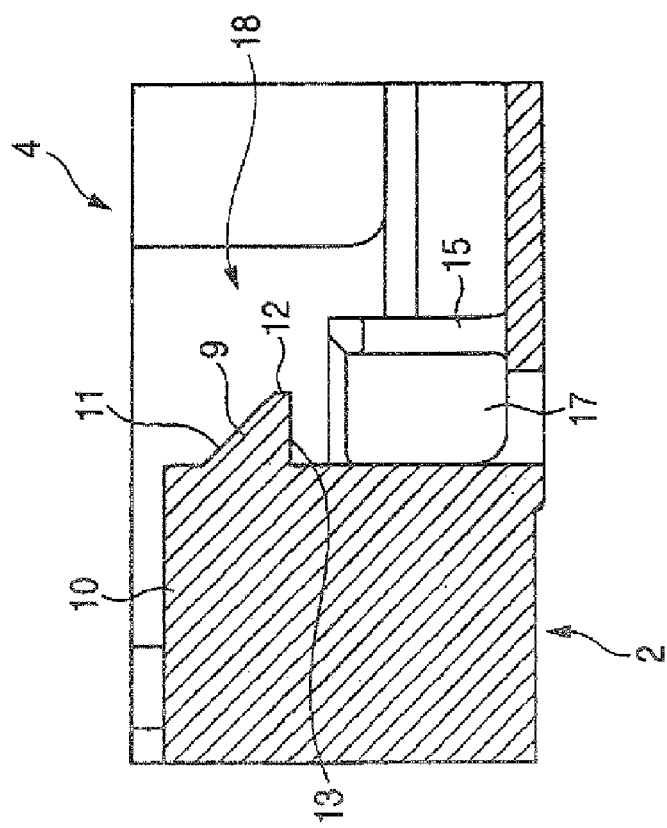
FIG. 6A
FIG. 6B

STRUCTURE OF INTERCONNECTION FITTING OF DIVISION PROTECTORS

BACKGROUND OF THE INVENTION

1. Field of the Invention

This invention relates to a harness protector comprising a plurality of division protectors fittingly interconnected, and more particularly to a structure of interconnection fitting of the division protectors forming the harness protector.

2. Related Art

A wire harness for installation on a mobile body such as an automobile is received in a harness protector having a generally U-shaped or channel-shaped cross-section, and in this condition the harness protector is fixed to a vehicle body, thereby installing the wire harness along a predetermined path. Referring to the fixing of the harness protector, stud bolts are fixed respectively to a plurality of portions of the vehicle body by welding, and are arranged along the installation path. The harness protector has a plurality of fixing portions each having a fixing hole for the passage of the stud bolt therethrough. These fixing portions are so arranged as to correspond respectively to the positions of the stud bolts. The stud bolts are passed respectively through the fixing holes, and then nuts are threaded respectively on the stud bolts, thereby fixedly securing the harness protector to the vehicle body.

The stud bolts are fixed to the vehicle body by welding as described above. Therefore, depending on the accuracy of a welding operation, some stud bolts are often deviated or offset slightly from their proper positions. Therefore, in the harness protector, each fixing portion is formed into such a structure as to absorb such a positional deviation (see, for example, JP-A-7-310721 Publication mentioned below).

Incidentally, the range over which a wire harness is held in a harness protector is often long, and in this case, if an attempt is made to produce a long harness protector corresponding to such long range, a mold for molding the harness protector becomes large in size, and also a molding machine becomes large in scale. Therefore, usually, this procedure is not adopted, and instead there is commonly used means for interconnecting a plurality of division protectors in a fitting manner.

In the harness protector comprising the plurality of division protectors fittingly interconnected, there are occasions when it is difficult to absorb a positional deviation of the stud bolt merely by the structure of the fixing portion for passing the stud bolt therethrough. Therefore, this is a problem.

And besides, in the harness protector, the shape of the fixing portion is influenced by the shape of the vicinities of a mounting portion of the vehicle body, and therefore it is difficult to provide the complicated positional deviation-absorbing structure, which would affect the mounting, at the fixing portion. This is also a problem.

SUMMARY OF THE INVENTION

This invention has been made in view of the above circumstances, and an object of the invention is to provide a structure of interconnection fitting of division protectors, in which a positional deviation of a stud bolt can be sufficiently absorbed even when a harness protector is formed by the division protectors.

According to one aspect of the invention, there is provided a structure of interconnection fitting of division protectors fittingly interconnected to form a harness protector, wherein the plurality of division protectors have interconnection fitting portions at their end portions; characterized in that retaining projections are formed at one of the interconnection fitting portions which are to be fittingly interconnected; and elastic retaining arms are formed at the other of the interconnection fitting portions, each of the elastic retaining arms producing an urging force outwardly in a widthwise direction of the division protector which is generally perpendicular to a direction of fitting/disconnecting of the division protectors and also to a longitudinal direction of the division protector; and the retaining projections are arranged to be paired in the widthwise direction, and the elastic retaining arms are arranged to be paired in the widthwise direction.

In the invention having the above features, the division protectors are fittingly interconnected by the retaining projections (paired in the widthwise direction of the division protector) and the elastic retaining arms paired in the widthwise direction of the division protector. The retaining arm produces the urging force outwardly in the widthwise direction of the division protectors and is engaged with the retaining projection, thereby satisfactorily maintaining the fitted condition. The elastic retaining arm, while producing the urging force, is allowed to be elastically deformed in the widthwise direction of the division protector. Therefore, the interconnection fitting portion having the elastic retaining arms can be moved in the widthwise direction of the division protector. In the interconnection fitting structure of the invention, such elastic deformation, the urged condition and this movement, a positional deviation of the stud bolt can be absorbed.

According to another aspect of the invention, there is provided a structure of interconnection fitting of division protectors fittingly interconnected to form a harness protector, wherein the plurality of division protectors have interconnection fitting portions at their end portions; characterized in that a retaining projection is formed at one of the interconnection fitting portions which are to be fittingly interconnected; and an elastic retaining arm is formed at the other of the interconnection fitting portions, the elastic retaining arm producing an urging force outwardly in a widthwise direction of the division protector which is generally perpendicular to a direction of fitting/disconnecting of the division protectors and also to a longitudinal direction of the division protector; and elastic deformation limitation walls for limiting elastic deformation of the elastic retaining arm are formed near respectively to the retaining projection and the elastic retaining arm so as to abut against each other upon movement in a predetermined amount in the widthwise direction.

In the invention having the above features, the division protectors are fittingly interconnected by the retaining projection, the elastic retaining arm and the elastic deformation limitation walls disposed near respectively to the retaining projection and the elastic retaining arm. The retaining arm produces the urging force outwardly in the widthwise direction of the division protector, and is engaged with the retaining projection, thereby satisfactorily maintaining the fitted condition. Referring to the urging force of the elastic retaining arm, in the case where the elastic retaining arm is not provided in a paired form, a force in a direction opposite to the direction of the urging force is received by the elastic deformation limitation walls. On the other hand, in the case where the elastic retaining arms are provided in a paired form, this arrangement is as recited in claim 3. The elastic retaining arm, while producing the urging force, is allowed to be elastically deformed in the widthwise direction of the division protector. Therefore, the interconnection fitting portion having the elastic retaining arm can be moved in the widthwise direction of the division protector. In the interconnection fitting structure of the invention, such elastic deformation, the urged condition and this movement, a positional deviation of the stud bolt can be absorbed.

The division protector interconnection fitting structure of the invention, is characterized in that the retaining projections are arranged to be paired in the widthwise direction, and the elastic retaining arms are arranged to be paired in the widthwise direction.

In the invention having the above features, the division protectors are fittingly interconnected by the retaining projections paired in the widthwise direction of the division protector, the elastic retaining arms paired in the widthwise direction of the division protector, and the elastic deformation limitation walls disposed near respectively to the retaining projections and the elastic retaining arms. The number of the portions fitting interconnected increases, and therefore the fitted condition becomes stable, thus enabling the harness protector to perform its function more effectively.

The division protector interconnection fitting structure of the invention is characterized in that stoppers are formed near respectively to the retaining projection and the elastic retaining arm so as to abut against each other to limit a relative movement of the fittingly-interconnected interconnection fitting portions in the longitudinal direction.

In the invention having the above features, jolting of the division protectors in the longitudinal direction is limited. Therefore, the retaining projection is positively kept engaged with the elastic retaining arm, and the fitted condition of the division protectors can be made more stable.

The division protector interconnection fitting structure of the invention is characterized in that a fixing portion is formed at each of the division protectors, and the fixing portion has a fixing hole for the passage of a stud bolt therethrough, and the fixing hole is elongate in the longitudinal direction.

In the invention having the above features, a positional deviation of the stud bolt can be absorbed also by the fixing hole elongate in the longitudinal direction of the division protector. With the structure of the invention of any one of claims 1 to 4, the structure of the fixing portion itself can be simplified to such a degree that what is required is merely the formation of the fixing hole elongate in the longitudinal direction.

In the invention, there is achieved an advantage that a positional deviation of the stud bolt can be sufficiently absorbed. Further in the third and fourth aspects of the invention, there is achieved an advantage that the fitted condition of the division protectors can be made stable. In the fifth aspect of the invention, there is achieved an advantage that a positional deviation of the stud bolt can be absorbed also by the fixing hole. Furthermore, in the invention, the structure of the fixing portion can be made much more simpler as compared with the conventional structure.

BRIEF DESCRIPTION OF THE DRAWINGS

FIG. 6A is a cross-sectional view of the retaining projection taken along the line VI-VI of FIG. 4, and FIG. 6B is a cross-sectional view of the elastic retaining arm taken along the line VI-VI of FIG. 4.

DETAILED DESCRIPTION OF THE PREFERRED EMBODIMENTS

Figure 1:
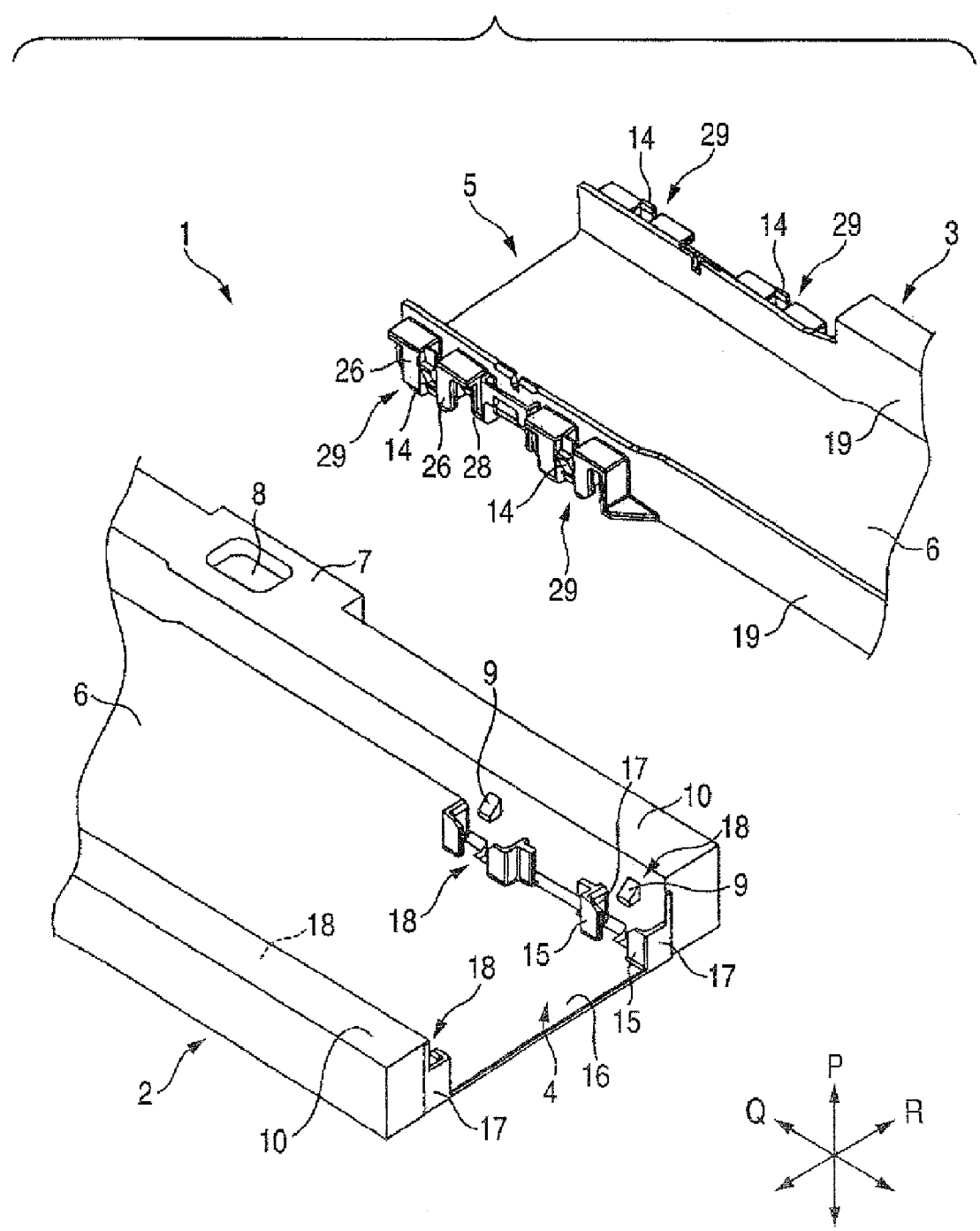
FIG. 1 is a perspective view of one preferred embodiment of a division protector interconnection fitting structure of the present invention.
Figure 2:
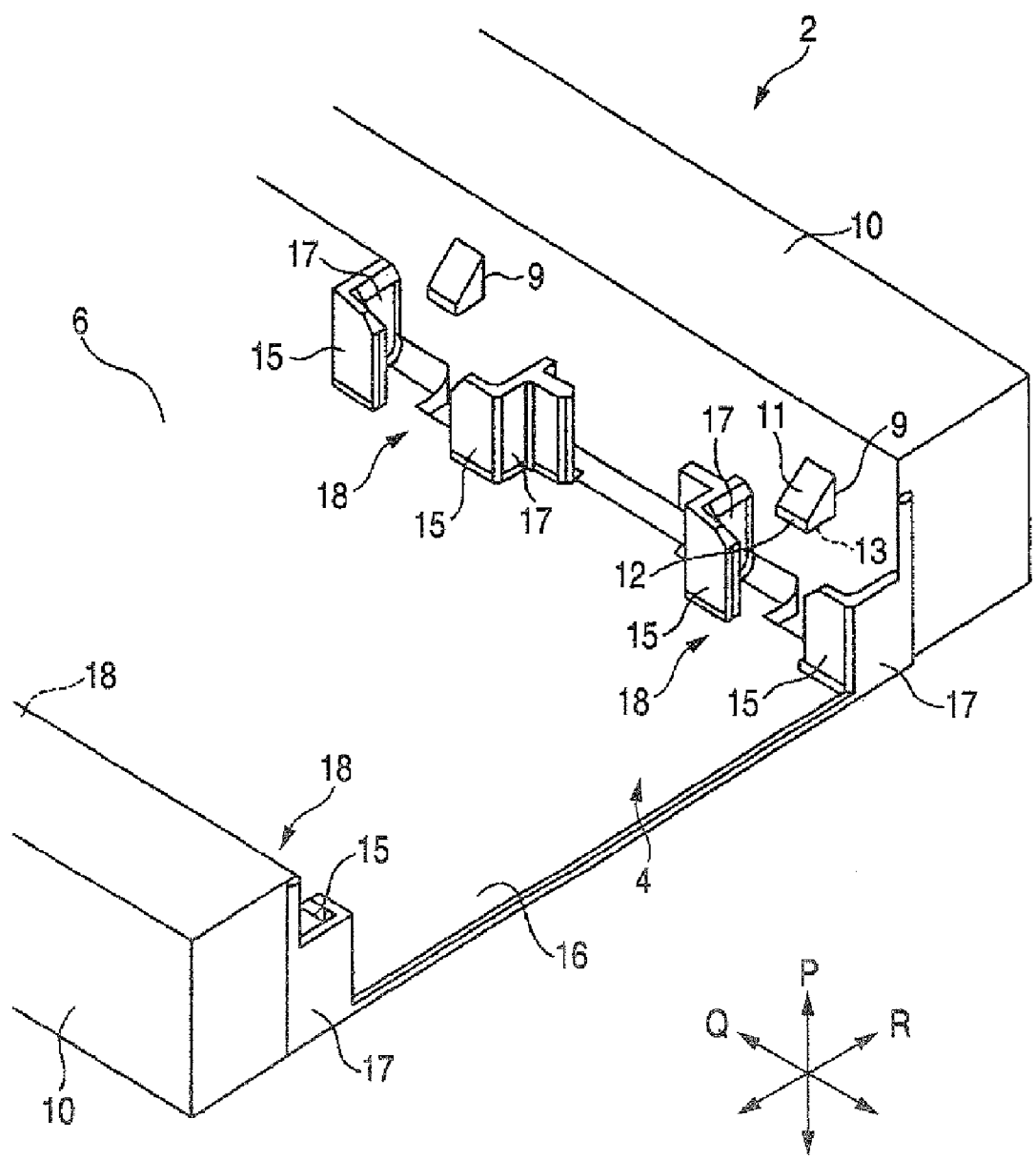
FIG. 2 is an enlarged perspective view of an interconnection fitting portion having retaining projections.
Figure 3:
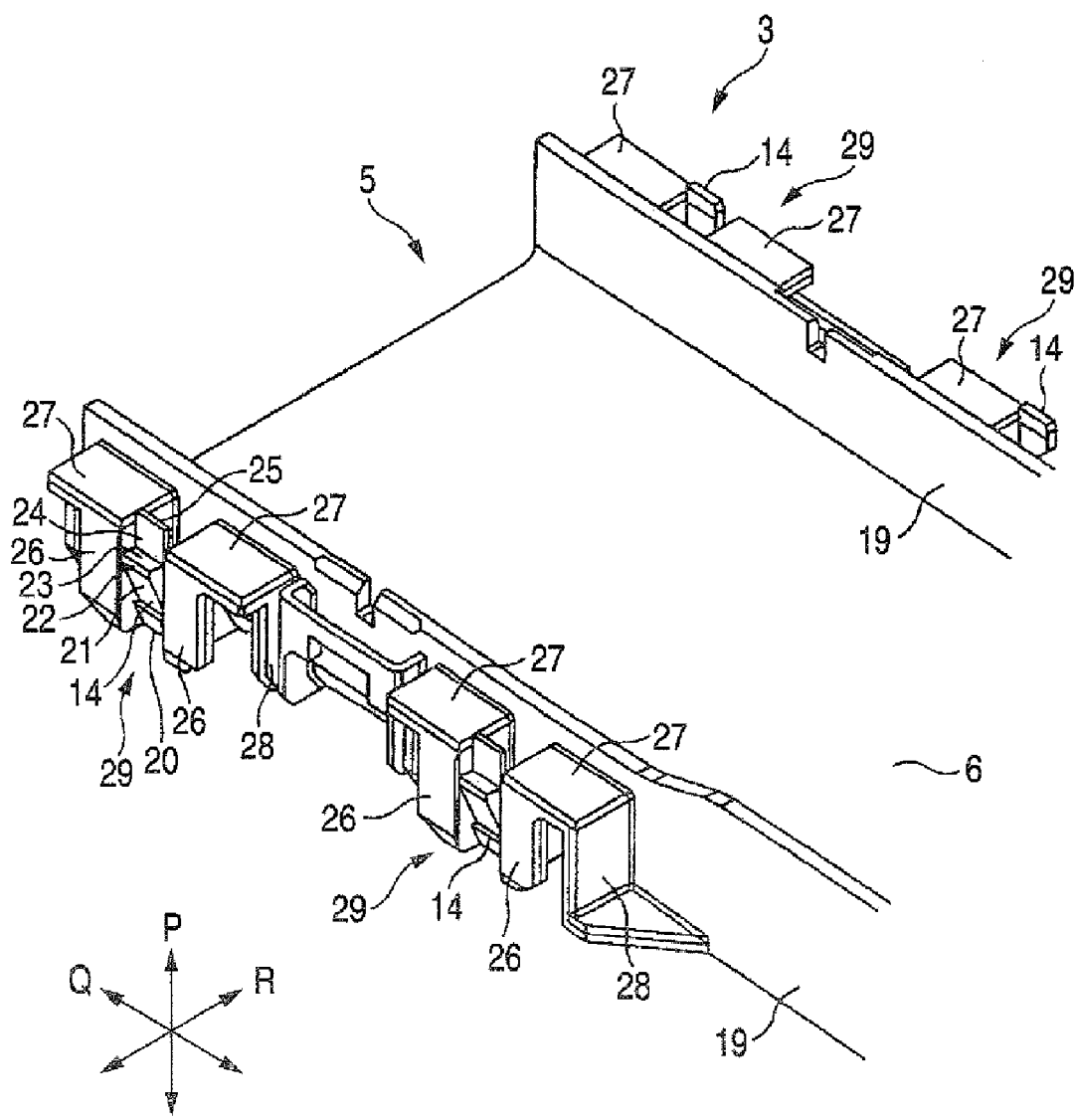
FIG. 3 is an enlarged perspective view of an interconnection fitting portion having elastic retaining arms.
Figure 4:
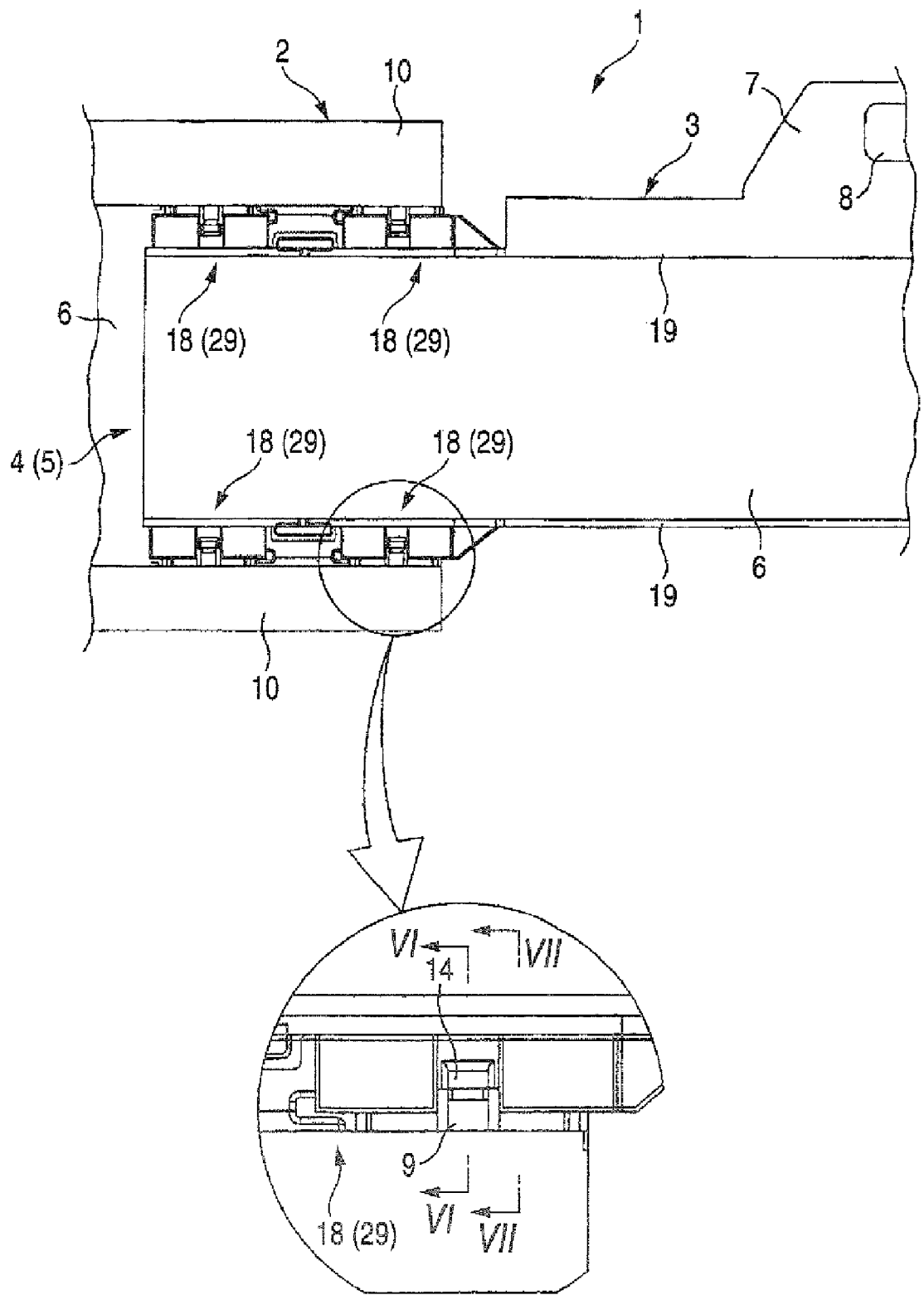
FIG. 4 is a plan view showing a fittingly-interconnected condition (An encircled portion is an enlarged view of an important portion).
Figure 5A:
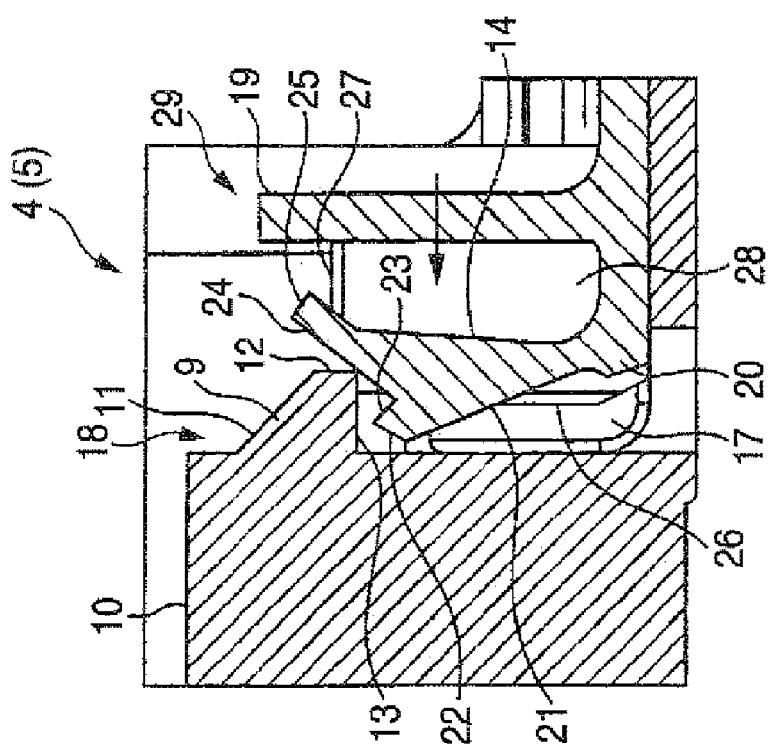
FIG. 5A is a cross-sectional view taken along the line VI-VI of FIG. 4.
Figure 5B:
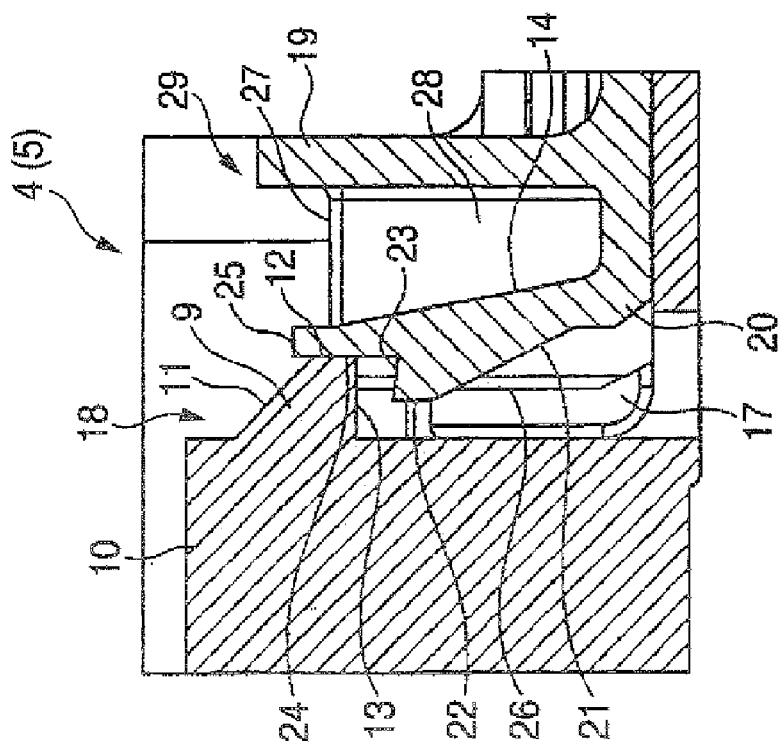
FIG. 5B is a cross-sectional view showing a condition in which the interconnection fitting portion is moved from its position shown in FIG. 5B.
Figure 7:
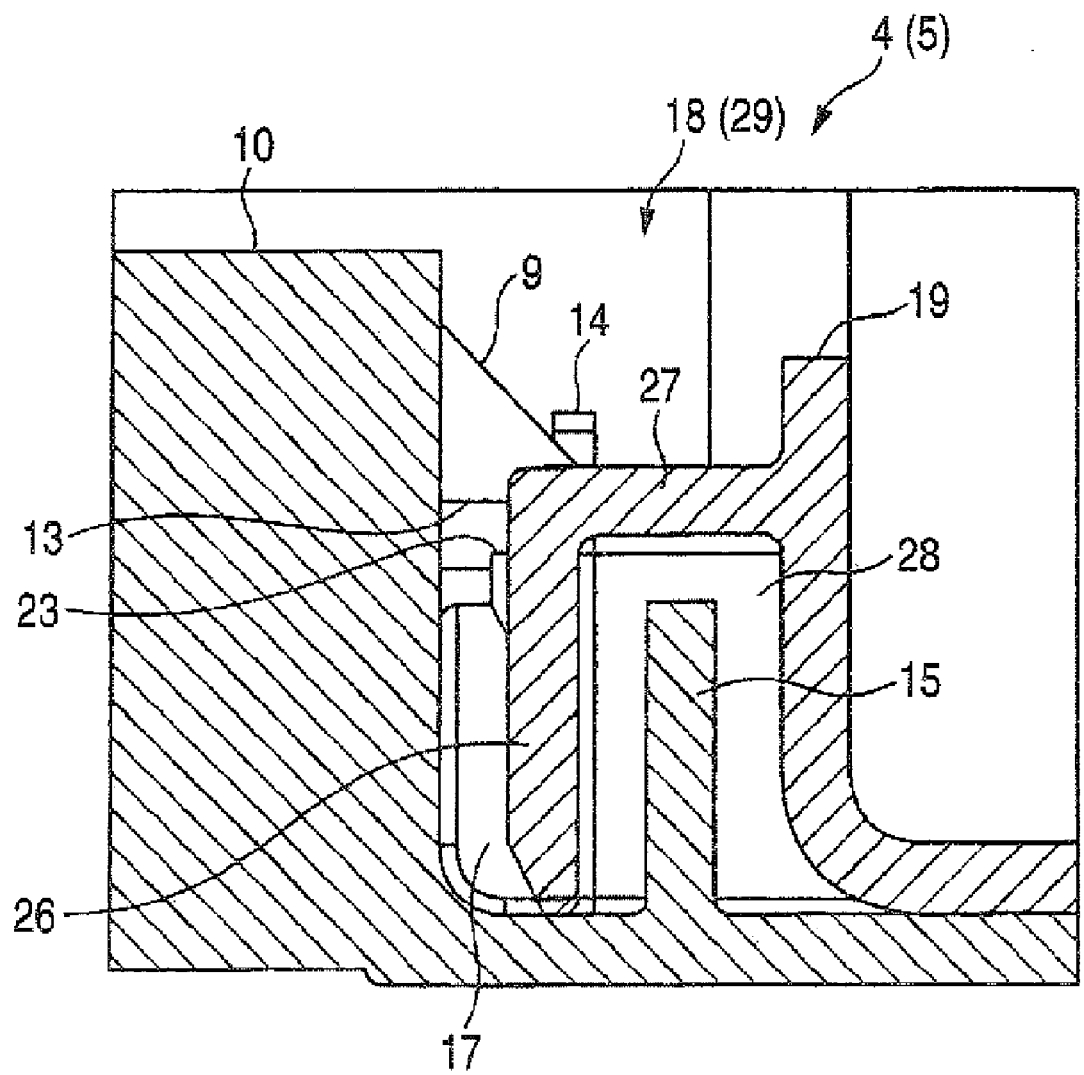
FIG. 7 is a cross-sectional view taken along the line VII-VII of FIG. 4.

The present invention will now be described with reference to the drawings. FIG. 1 is a perspective view of one preferred embodiment of a division protector interconnection fitting structure of the invention. FIG. 2 is an enlarged perspective view of an interconnection fitting portion having retaining projections, FIG. 3 is an enlarged perspective view of an interconnection fitting portion having elastic retaining arms, FIG. 4 is a plan view showing a fittingly-interconnected condition (An encircled portion is an enlarged view of an important portion), FIG. 5A is a cross-sectional view taken along the line VI-VI of FIG. 4, FIG. 5B is a cross-sectional view showing a condition in which the interconnection fitting portion is moved from its position shown in FIG. 5B, FIG. 6A is a cross-sectional view of the retaining projection taken along the line VI-VI of FIG. 4, FIG. 6B is a cross-sectional view of the elastic retaining arm taken along the line VI-VI of FIG. 4, and FIG. 7 is a cross-sectional view taken along the line VII-VII of FIG. 4.

FIG. 1 shows a harness protector 1 made of a synthetic resin, and after a wire harness is received in the harness protector 1, this harness protector 1 is fixed to a vehicle body of an automobile or the like. The harness protector 1 is formed by fittingly interconnecting a required number of division protectors 2 and 3 so that the harness protector can cover the necessary range (distance) to protect the wire harness.

The interconnection fitting portions 4 and 5 (through which the division protectors 2 and 3 are fittingly interconnected) are provided respectively at their end portions of the division protectors 2 and 3. In this embodiment, although not particularly shown, the same structure as that of the interconnection fitting portion 5 of the division protector 3 is formed at the other end portion of the division protector 2, while the same structure as that of the interconnection fitting portion 4 of the division protector 2 is formed at the other end portion of the division protector 3 (so that the fitting interconnection can be repeated so as to cover the necessary range).

The division protectors 2 and 3 have a generally U-shaped (or channel-shaped) cross-section, and the interconnection fitting portion 5 is adapted to be fitted in the interconnection fitting portion 4. The division protectors 2 and 3 have respective reception/installation spaces 6 for receiving the wire harness therein. The division protectors 2 and 3 also have fixing portions 7. The fixing portions 7 are mounting portions to be mounted on the vehicle body, and have respective fixing holes 8, and stud bolts welded to the vehicle body are passed through the fixing holes 8, respectively. Each fixing hole 8 is formed into an elongate shape (such as an elongate oval shape, a rectangular shape, etc.) such that its longitudinal axis extends in a longitudinal direction Q as described later.

Before explaining the interconnection fitting portions 4 and 5, a double head-arrow line P in FIG. 1 is defined to indicate a direction of fitting of the division protectors 2 and 3 to each other and also a direction of disconnection of the protectors 2 and 3 from each other. A double head-arrow line Q is defined to indicate the longitudinal direction of the division protector 2, 3. A double head-arrow R is defined to indicate a direction of the width of the division protector 2, 3. The interconnection fitting portions 4 and 5 will be described below with reference to FIGS. 1 to 7.

The interconnection fitting portion 4 has the retaining projections 9. In this embodiment, although not particularly limited, the retaining projections 9 are arranged to be paired in the widthwise direction R. Also, the retaining projections 9 are arranged in the longitudinal direction Q. Each retaining projection 9 is a claw-like projections and the retaining projections 9 are formed on inner surfaces of side walls 10 of the division protector 2. The retaining projection 9 includes a slanting surface 11, an urging force-receiving surface 12 and a retaining surface 13 which are arranged in this order from the upper side in the drawings.

When the interconnection fitting portion 4 is to be fitted to the interconnection fitting portion 5, the slanting surface 11 serves to elastically deform (or bend) the elastic retaining arm 14 (described later) so as to smoothly effect this fitting operation. The urging force-receiving surface 12 is formed mainly for receiving an urging force from the elastic retaining arm 14. The urging force-receiving surface 12 is disposed parallel to the side wall 10 (that is, parallel to the fitting/disconnecting direction P). The retaining surface 13 can be engaged with the elastic retaining arm 14 to retain the same against disengagement (that is, withdrawal). The retaining surface 13 is disposed in perpendicularly intersecting relation to the side wail 10 (that is, perpendicular to the fitting/disconnecting direction P).

A pair of elastic deformation limitation walls 15 and 15 are formed in the vicinity of each retaining projection 9. The elastic deformation limitation walls 15 and 15 are formed respectively at opposite sides of the retaining projection 9 so as to limit the amount of elastic deformation of the elastic retaining arm 14 (described later). The elastic deformation limitation walls 15 and 15 are formed on and project from a bottom wall 16 of the division protector 2 (in a direction parallel to the fitting/disconnecting direction P). In this embodiment, these limitation walls 15 and 15 have a height lower than that of the retaining projection 9. Also, the elastic deformation limitation walls 15 and 15 are spaced a predetermined distance from the side wall 10.

Reference numeral 17 denotes a wall functioning as a stopper. In this embodiment, a plurality of walls 17 are formed, and more specifically two walls 17 are formed in continuous relation to each pair of elastic deformation limitation walls 15 and 15, respectively, and also in continuous relation to the side wall 10. The walls 17 are formed in perpendicularly intersecting relation to the respective elastic deformation limitation walls 15 and 15 and also to the side wall 10. The walls 17 serve to limit a relative movement of the interconnection fitting portions 4 and 5 in the longitudinal direction Q (in a manner to completely prevent the movement or in a manner to allow a slight movement) so as to satisfactorily maintain the engagement of the retaining projection 9 with the elastic retaining arm 14.

When the interconnection fitting portion 4 is viewed from the upper side, each retaining projection 9 is surrounded by the elastic deformation limitation walls 15 and 15 and the walls 17 and 17. In this embodiment, although there are provided four fitting main portions 18 each including the retaining projection 9, the pair of elastic deformation limitation walls 15 and 15, and the pair of walls 17 and 17, this number of the fitting main portions 18 is given as one example. A rectangular through hole (Reference numeral thereof is omitted here) in the fitting main portion 18 is a mold removal hole formed for the purpose of forming the retaining projections 9.

The interconnection fitting portion 5 for fitting in the interconnection fitting portion 4 of the above construction has the elastic retaining arms 14. The elastic retaining arms 14 are formed so as to correspond to the arrangement of the retaining projections 9. In this embodiment, the elastic retaining arms 14 are arranged to be paired in the widthwise direction R. Also, the elastic retaining arms 14 are arranged in the longitudinal direction Q. The elastic retaining arm 14 is formed to have a so-called rocking arm structure. The elastic retaining arms 14 are formed on outer surfaces of side walls 19 of the division protector 3. The elastic retaining arm 14 includes a lower-side proximal end portion 20, a slanting surface 21, an upper surface 22, a retaining engagement surface 23, an urging surface 24, and a distal end 25 which are arranged in this order from the lower side in the drawings.

The elastic retaining arm 14 is formed such that the distal end 25 is spaced farther than the side wail 19 of the division protector 3 than the proximal end portion 20 is. The elastic retaining arm 14 has elasticity, and is so formed as to produce a sufficient urging force outwardly.

The slanting surface 21 is brought into abutting engagement with the slanting surface 11 of the interconnection fitting portion 4, and slides on this slanting surface 11 and a boundary portion between the slanting surface 11 and the urging force-receiving surface 12. The upper surface 22 is formed between the slanting surface 21 and the retaining engagement surface 23, depending on the position of the retaining engagement surface 23 and the angle of inclination of the slanting surface 21. When the interconnection fitting portion 5 is moved in the disconnecting direction P, the retaining engagement surface 23 is brought into engagement with the retaining surface 13 of the interconnection fitting portion 4, and is retained by this retaining surface 13. When fitting the interconnection fitting portion 5 into the interconnection fitting portion 4, the urging surface 4 is brought into abutting engagement with the retaining projection 9 to press this retaining projection 9. For example, when the fitted condition of the interconnection fitting portions 4 and 5 is to be canceled, the distal end 25 serves as an operating portion which can be manipulated by the finger.

A pair of elastic deformation limitation walls 26 and 26 are formed in the vicinity of each elastic retaining arm 14. The elastic deformation limitation walls 26 and 26 can abut respectively against the elastic deformation limitation walls 15 and 15 of the interconnection fitting portion 4 to limit the amount of elastic deformation of the elastic retaining arm 14. The elastic deformation limitation walls 26 and 26 are formed respectively at opposite sides of the elastic retaining arm 14. The elastic deformation limitation walls 26 and 26 are so arranged as to be disposed in registry with the respective elastic deformation limitation walls 15 and 15 of the interconnection fitting portion 4. Also, the elastic deformation limitation walls 26 and 26 are so arranged as to be inserted from the upper side (in the drawings) to be disposed inwardly respectively of the elastic deformation limitation walls 15 and 15. The elastic deformation limitation walls 26 and 26 and the elastic deformation limitation walls 15 and 15 can abut against each other upon movement in a predetermined amount in the widthwise direction R.

Reference numeral 27 denotes walls 27 through which the elastic deformation limitation walls 26 are formed on the division protector 3. The plurality of walls 27 are formed on and project from the side walls 19 of the division protector 3. Reference numeral 28 denotes walls for abutting the walls 17

(each having the function of the stopper), and the walls 28 have the same function as the walls 17. Reference numeral 29 denotes fitting main portions each including the elastic retaining arm 14, the pair of elastic deformation limitation walls 26 and 26, etc.

Next, the interconnection fitting of the interconnection fitting portions 4 and 5 to each other will be described with reference to the above construction.

The interconnection fitting portion 5 is placed on the interconnection fitting portion 4, and then when this interconnection fitting portion 5 is moved in the fitting direction P (that is; moved downward in the drawings), the slanting surface 21 of each elastic retaining arm 14 is first brought into abutting engagement with the slanting surface 11 of the corresponding retaining projection 9. Then, when the downward movement is continued, the slanting surface 21 slides on the slanting surface 11, and therefore the elastic retaining arm 14 is elastically deformed toward the side wall 19, and the upper surface 22 and the retaining engagement surface 23 of the elastic retaining arm 14 sequentially pass past the urging force-receiving surface 12 and the retaining surface 13 of the retaining projection 9. When the elastic retaining arm 14 is returned or restored into the original position after this passing operation, the urging surface 24 of the elastic retaining arm 14 is brought into surface-to-surface contact with the urging force-receiving surface 12 of the retaining projection 9, and urges (or presses) this urging force-receiving surface 12 (Fee FIG. 5A). As a result, the fitted condition is achieved, so that the division protectors 2 and 3 are interconnected.

At this time, each pair of elastic deformation limitation walls 26 and 26 of the interconnection fitting portion 5 are inserted to be disposed inwardly respectively of the corresponding pair of elastic deformation limitation walls 15 and 15 of the interconnection fitting portion 4 as shown in FIG. 7.

In the fitted condition of the retaining projection 9 and the elastic retaining arm 14, if an external force acts on the interconnected division protector in the disconnecting direction P, the retaining engagement surface 23 of the elastic retaining arm 14 is engaged with the retaining surface 13 of the retaining projection 9, thereby preventing withdrawal. And besides in the fitted condition, the urging surface 24 of the elastic retaining arm 14 is urged to be pressed against the urging force-receiving surface 12 of the retaining projection 9, and therefore the withdrawal is also suppressed by this effect.

The elastic retaining arm 14 has elasticity. Therefore, when the interconnection fitting portion 5 is moved in the widthwise direction R (that is, in a direction indicated by an arrow in FIG. 5B), the elastic retaining arm 14 is elastically deformed toward the side wall 19. At this time, the retaining engagement surface 23 of the elastic retaining arm 14 is still disposed beneath the retaining surface 13 of the retaining projection 9, and the urging surface 24 of the elastic retaining arm 14 is still urged to be pressed against the urging force-receiving surface 12 of the retaining projection 9, and therefore the withdrawal is prevented. On the other hand, by the movement in the above direction, the other (not shown) of the pair of elastic retaining arms 14 is elastically deformed in a direction toward its original position where it has been disposed before the above fitting operation. With respect to the other (that is, the opposite) elastic retaining arm 14, the retaining engagement surface 23 is still disposed beneath the retaining surface 13 of the retaining projection 9, and the urging surface 24 is still urged to be pressed against the urging force-receiving surface 12 of the retaining projection 9, and therefore the withdrawal is prevented also at the opposite side.

As described above with reference to FIGS. 1 to 7, in the interconnection fitting structure of the invention, even if any stud bolt is offset from its proper position, this positional deviation can be easily absorbed by the elastic deformation and urged condition of the elastic retaining arms 14 and the movement in the widthwise direction R and also by the fixing holes 8 of the fixing portions 7. Therefore, the problems with the conventional structure can be solved.

Next, modified examples of the interconnection fitting structure of the invention will be briefly described. A basic structure of the modified examples described below has already been described above, and therefore the showing thereof in the drawings is omitted here.

In the first modified example, one fitting main portion 17 is provided at the interconnection fitting portion 4, or two fitting main portions 17 are provided in such a manner that the two are arranged laterally one or two fitting main portions 29 (corresponding in number to the fitting main portions 17 of the interconnection fitting portion 4) are provided at the interconnection fitting portion 5. In the second modified example, only the retaining projections 9 are provided at the interconnection fitting portion 4 in such a manner that they are paired in the widthwise direction R, and only the elastic retaining arms 14 are provided at the interconnection fitting portion 5 in such a manner that they are paired in the widthwise direction R. In either of the modified examples, there is achieved an advantage that a positional deviation of any stud bolt can be absorbed.

Furthermore, other various modifications can be made without departing from the subject matter of the invention.

What is claimed is:

1. A structure of interconnection fitting of division protectors fittingly interconnected to form a harness protector, comprising a plurality of division protectors having interconnection fitting portions at end portions thereof;

wherein retaining projections are formed at one of the interconnection fitting portions which are to be fittingly interconnected;

elastic retaining arms are formed at the other of said interconnection fitting portions, each of said elastic retaining arms producing an urging force outwardly in a widthwise direction of said division protector which is generally perpendicular to a direction of fitting/disconnecting of said division protectors and also to a longitudinal direction of said division protector;

elastic deformation limitations walls adapted to limit elastic deformation of said elastic retaining arms, the elastic deformation limitations walls being formed at least on the interconnection fitting portion having the elastic retaining arms formed thereon; and said retaining projections are arranged to be paired in said widthwise direction, and said elastic retaining arms are arranged to be paired in said widthwise direction.

2. A structure of interconnection fitting of division protectors according to claim 1, wherein a fixing portion is formed in at least one of said division protectors, and said fixing portion has a fixing hole for the passage of a stud bolt therethrough, and said fixing hole is elongate in said longitudinal direction.

3. A structure of interconnection fitting of division protectors according to claim 1, wherein said retaining projections are arranged in pairs in said widthwise direction so that one retaining projection is substantially opposite another retaining projection across a first installation space on one of the interconnection fitting portions; and wherein said elastic retaining arms are arranged in pairs in said widthwise direction so that one elastic retaining arm is substantially opposite another elastic retaining arm across a second installation space on the other of said interconnection fitting portions.

4. A structure of interconnection fitting of division protectors fittingly interconnected to form a harness protector, comprising: a plurality of division protectors having interconnection fitting portions at end portions thereof;

wherein a retaining projection is formed at one of the interconnection fitting portions which are to be fittingly interconnected; and an elastic retaining arm is formed at the other of said interconnection fitting portions, said elastic retaining arm producing an urging force outwardly in a widthwise direction of said division protector which is generally perpendicular to a direction of fitting/disconnecting of said division protectors and also to a longitudinal direction of said division protector; and elastic deformation limitation walls for limiting elastic deformation of said elastic retaining arm are formed near respectively to said retaining projection and said elastic retaining arm so as to abut against each other upon movement of a predetermined amount in said widthwise direction; and wherein a fixing portion is formed in at least one of said division protectors, and said fixing portion has a fixing hole for the passage of a stud bolt therethrough, and said fixing hole is elongate in said longitudinal direction.

5. A structure of interconnection fitting of division protectors according to claim 4, wherein said retaining projections are arranged to be paired in said widthwise direction, and said elastic retaining arms are arranged to be paired in said widthwise direction.

6. A structure of interconnection fitting of division protectors according to claim 4, wherein stoppers are formed near respectively to said retaining projection and said elastic retaining arm so as to abut against each other to limit a relative movement of said fittingly-interconnected interconnection fitting portions in the longitudinal direction.

* * * * *